United States Patent [19]
Zivny et al.

[11] Patent Number: 5,530,341
[45] Date of Patent: Jun. 25, 1996

[54] EXTERNAL CLOCK COUNT BASED AUTO TRIGGER FOR AN OSCILLOSCOPE

[75] Inventors: Pavel R. Zivny, Portland; Edward E. Averill, Beaverton, both of Oreg.

[73] Assignee: Tektronix, Inc., Wilsonville, Oreg.

[21] Appl. No.: 320,722

[22] Filed: Oct. 11, 1994

[51] Int. Cl.⁶ .................................................. G01R 13/29
[52] U.S. Cl. ..................... 324/121 R; 341/122; 341/123; 341/142
[58] Field of Search ................... 324/121 R, 102; 327/1, 91,41; 341/122, 123, 141, 142

[56] References Cited

U.S. PATENT DOCUMENTS 4,047,115  9/1977  Toda et al. ............................ 327/41
4,283,713  8/1981  Philipp .................................. 341/142
4,654,632  3/1987  Yoshida et al. ....................... 341/141

Primary Examiner—Kenneth A. Wieder
Assistant Examiner—Kourosh Cyrus Khosravi
Attorney, Agent, or Firm—Brent F. Logan; Boulden G. Griffith

[57] ABSTRACT

A trigger system for a digital oscilloscope operating in external clock mode. Every n pulses, the trigger system generates a trigger signal. The trigger system therefore provides a trigger every n samples of the input signal waveform.

10 Claims, 2 Drawing Sheets

5,530,341

EXTERNAL CLOCK COUNT BASED AUTO TRIGGER FOR AN OSCILLOSCOPE

BACKGROUND OF THE INVENTION

1. Technical Field

The present invention relates to a trigger system for an oscilloscope, and particularly to a system that counts external events to provide a trigger for irregular input signals.

2. Background of the Invention

In conventional digital storage oscilloscopes, a trigger generator receives an input signal and, in response, generates a trigger signal synchronous to when the input signal exceeds a trigger threshold. The trigger generator works together with a time base control circuit which generates a periodic sampling clock signal. The digital oscilloscope samples the input signal in response to each sampling clock signal and stores the sample results in an acquisition memory. Thus, a conventional digital storage oscilloscope essentially duplicates the functionality of an analog oscilloscope; the data is acquired in a regular, periodic fashion.

There are certain data acquisition applications in which it would be more logical to sample the input signal in response to events other than the output of a regular, periodic clock signal. Existing oscilloscopes provide an "external clocking" function that provides just this capability.

By way of example, suppose one wished to display on an oscilloscope the force acting on an axle as a function of the axle's rotational angle. A transducer mounted at an appropriate location on the axle could provide an analog signal corresponding to the force. This analog signal would be the oscilloscope's input signal. If the axle rotates at a constant angular velocity, then an internally-generated, periodic clock signal from a time-base control circuit could clock the sampling of the input signal. Furthermore, another internally-generated periodic clock signal could trigger the oscilloscope. Such an internally-generated clock signal is used in an "auto trigger" mode. However, it is unlikely that the period of this second clock signal would correspond to the rotational period of the axle.

However, if the axle rotates at a non-constant velocity, then a regular, periodic clock signal would not be able to provide samples of the force transducer at regular axle angles. Furthermore, an auto trigger mode would not be appropriate because different rotations of the axle can occur in different amounts of time. Records acquired in an auto trigger mode would not align with each other.

A rotational transducer could be attached to the axle such that it produces a signal every time the axle's angle increases by a certain amount. This external "clock" signal would provide the stimulus for each sampling of the input signal. ("Clock" is in quotes to emphasize that such an externally-generated "clock" signal is not necessarily a regular, periodic signal. It will be used henceforth without quotes, but still with the understanding that an external clock signal is not necessarily a regular, periodic signal.) Another transducer on the axle could indicate when the axle rotates past a reference angle and thus provide the trigger signal.

The just-described data acquisition system requires three transducers: a force transducer, a rotational reference transducer, and a rotational transducer. It would be preferable to provide a data acquisition system that did not require the reference transducer.

What is needed is a system that generates trigger signals for irregularly-timed periodic input signals and that does not require a separate external input to signal the beginning of a period.

SUMMARY OF THE INVENTION

In accordance with the present invention, an oscilloscope uses an external clock signal to clock the sampling of an input signal waveform. Its trigger system counts the number of pulses in an external clock signal. Every n pulses, the trigger system generates a trigger signal.

It is therefore a feature of the present invention to provide a trigger system for a digital oscilloscope in external clock mode that provides a trigger every n samples of the input signal waveform.

It is another feature of the present invention to allow the number n to be changeable by the user of the oscilloscope, even while data acquisition is occurring.

These and other features and advantages of the present invention will become apparent to those skilled in the art when considering the following detailed description taken in conjunction with the appended drawings.

DETAILED DESCRIPTION OF THE INVENTION

Figure 1:
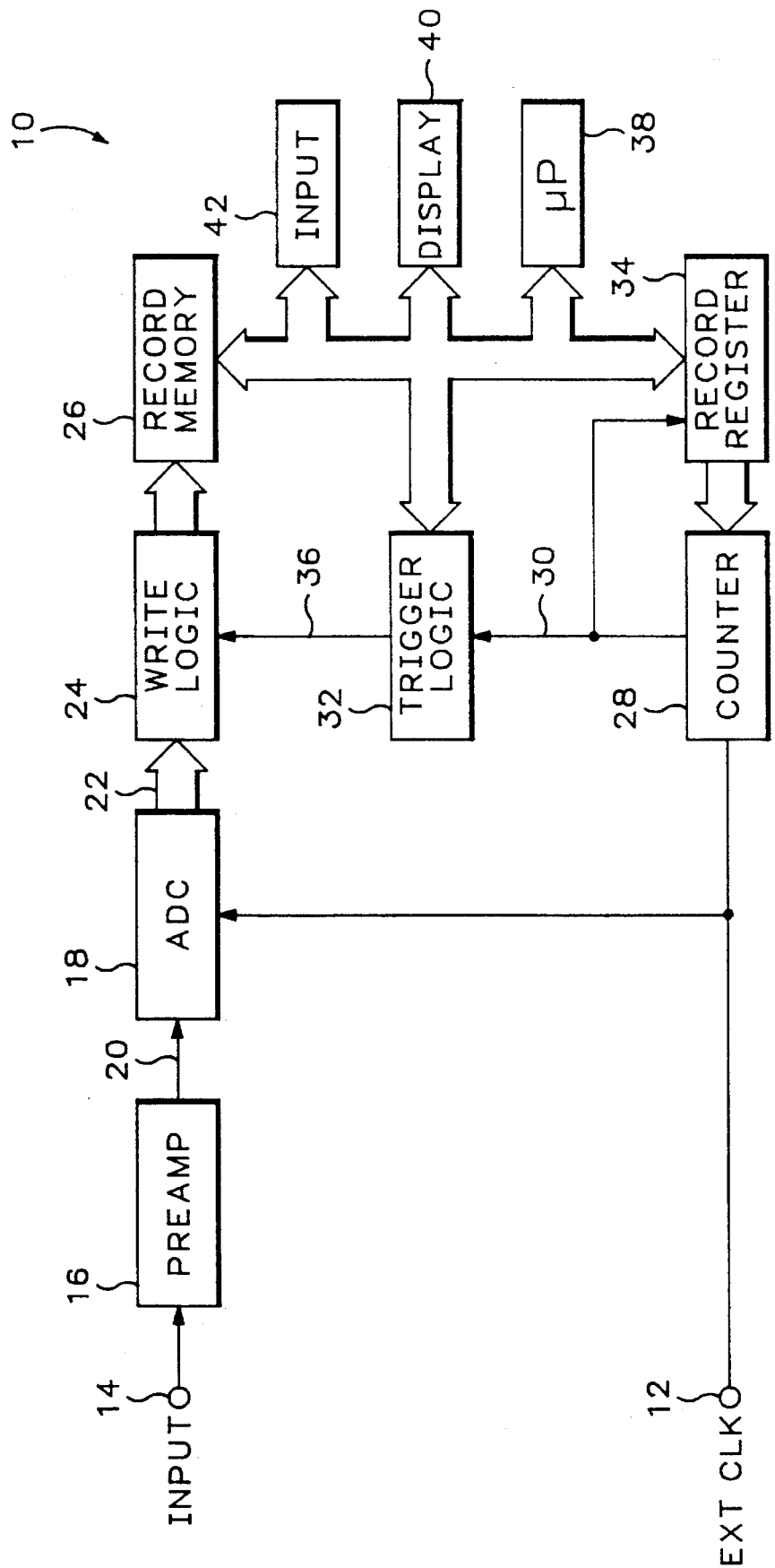
FIG. 1 is a block diagram of a digital oscilloscope employing a trigger system according to the present invention.

Referring to the block diagram of FIG. 1, a digital oscilloscope 10 according to the present invention uses an external clock signal (EXT CLK) 12 to trigger and clock the acquisition of an input signal (INPUT) 14. A preamplifier (PREAMP) 16 receives the input signal, amplifies it to within an appropriate range, and provides the resulting amplified signal 20 to a sampling analog-to-digital converter (ADC) 18. The sampling ADC 18 samples and converts the preamplified input signal 20 to an n-bit digital number in response to each pulse in the external clock signal 12, and provides the resulting number to write logic 24. The write logic 24 clocks the digital data into successive locations of a record memory 26.

A counter 28 receives the external clock signal 12 and counts the pulses contained therein. When the counter 28 reaches a user-settable value n, it provides a trigger signal 30 to trigger logic 32. The trigger signal 30 also causes the counter 28 to be reloaded.

Preferably a reload register 34 contains the settable value n. This value is loaded into the counter 28. Thereafter, each pulse in the external clock signal 12 decrements the counter 28. When the counter 28 underflows, it provides the trigger signal 30. The trigger signal 30 also causes the contents of the reload register 34 to be loaded into the counter 28.

The trigger logic 32 accepts the trigger signal 30 and responds as though it came from a time-based auto trigger circuit. The trigger logic 32 provides a trigger signal 36 to the write logic 24, and enables successive records to be aligned, as is well known in the art. The trigger logic 32 can include hold-off circuitry, as is well-known in the art, to allow the oscilloscope 10 to ignore some trigger signals and have enough time to process acquired records in record memory 26 before acquiring new records. The counter 28 continues to decrement and reload, allowing subsequent records to align correctly.

A microprocessor (μP) 38 controls the operation of the digital oscilloscope 10. The microprocessor 38 controls the value in the reload register 34. The microprocessor 38 reads the data from the record memory 26, processes it, and shows the results on a display 40.

The microprocessor also accepts input 42 from the user. The user is able to set the value n that is loaded into the reload register 34. The value n should correspond to the number of samples in one period of the input signal 14.

The user is also able to move the trigger point within the input signal period by decreasing or increasing the value n in the reload register 34 for one or more trigger cycles.

Figure 2:
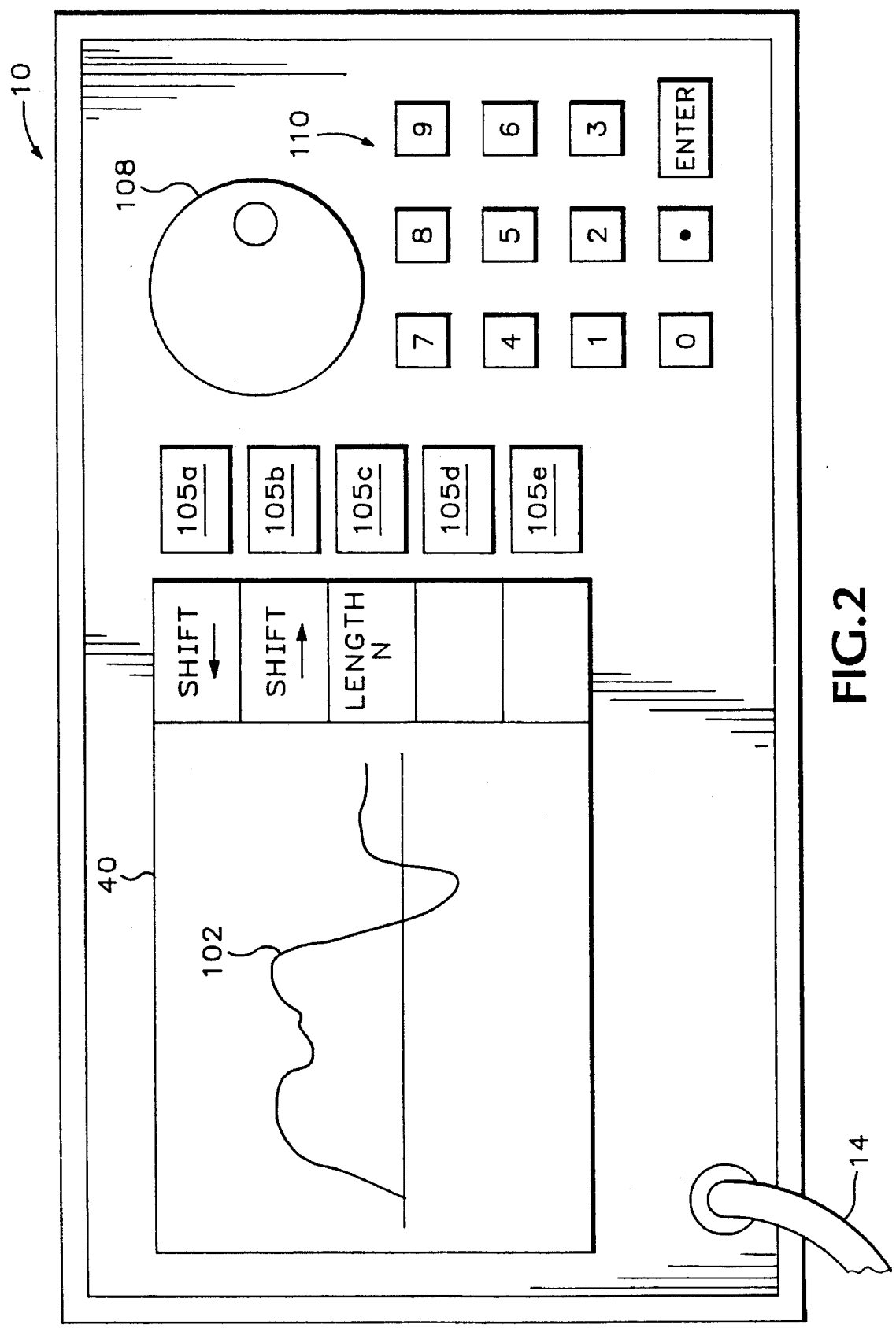
FIG. 2 is front view of an exemplary digital oscilloscope that includes the present invention.

Referring now to FIG. 2, an exemplary oscilloscope 10 includes a display 40 showing a trace 102 representing the input signal 14. A portion of the display 40 shows the function of function keys 105a–105e adjacent to the display 40. The first function key 105a enables the user to decrease the value n in the reload register 34 by one for a single cycle of the counter 28. This moves the trigger point earlier in the cycle. The second function key 105b enables the user to increase the value n in the reload register 34 by one for a single cycle of the counter 28.

The third function key 105c enables the user to set the value n user either a numeric keypad 110 or a thumb wheel 108. Adjacent to the third function key 105, the display 40 shows the current value of n.

The terms and expressions which have been employed in the foregoing specification are used therein as terms of description and not of limitation, and there is no intention, in the use of such terms and expressions, of excluding equivalents of the features shown and described or portions thereof, it being recognized the scope of the invention is defined and limited only by the claims which follow.

What is claimed is:

1. An oscilloscope for sampling an input waveform signal and storing results of said sampling in response to an external clock signal containing pulses, comprising:

sampling analog-to-digital converter adapted to sample said input waveform signal in response to each one of said pulses in said external clock signal and producing digital numbers;

memory means for receiving the digital numbers;

counter adapted to count said pulses and to provide a trigger signal in response to counting a first predetermined number of said pulses; and triggering circuitry adapted to trigger said memory means in response to said trigger signal.

2. The oscilloscope of claim 1, wherein said counter includes circuitry to reset said counter in response to counting said first predetermined number of said pulses.

3. The oscilloscope of claim 2, further comprising means to change said first predetermined number to a second predetermined number.

4. The oscilloscope of claim 3, further comprising means to change said second predetermined number to said first predetermined number in response to said trigger signal.

5. A method of sampling an input waveform signal and storing results of said sampling in memory in response to an external clock signal containing pulses, said method comprising the steps of:

sampling said input waveform signal in response to said external clock signal;

storing digital numbers produced by said sampling in memory in accordance with a trigger signal;

counting said pulses of said external clock signal; and generating the trigger signal in response to counting a first predetermined number of said pulses of said external clock.

6. The method of claim 5, further comprising the step of repeating said counting and said triggering steps.

7. The method of claim 6, further comprising the step of changing said first predetermined number to a second predetermined number.

8. The method of claim 7, further comprising the step of changing said second predetermined number to said first predetermined number in response to said triggering.

9. An oscilloscope according to claim 1 wherein the first predetermined number is user selectable.

10. A method according to claim 5 wherein the first predetermined number is user selectable.

* * * * *